US00RE43015E

(19) United States
(12) Reissued Patent
Yang

(10) Patent Number: US RE43,015 E
(45) Date of Reissued Patent: Dec. 13, 2011

(54) CAPACITIVE HIGH-SIDE SWITCH DRIVER FOR A POWER CONVERTER

(75) Inventor: Ta-yung Yang, Taipei Hsien (TW)

(73) Assignee: System General Corp., Taipei Hsien (TW)

( * ) Notice: This patent is subject to a terminal disclaimer.

(21) Appl. No.: 11/487,578

(22) Filed: Jul. 14, 2006

Related U.S. Patent Documents

Reissue of:

(64) Patent No.: 6,781,422
Issued: Aug. 24, 2004
Appl. No.: 10/666,801
Filed: Sep. 17, 2003

(51) Int. Cl.
*H03K 3/00* (2006.01)
*H03B 1/00* (2006.01)

(52) U.S. Cl. ..... 327/112; 327/108; 327/109; 327/110; 327/111; 326/82; 326/83; 326/85; 326/87; 326/88

(58) Field of Classification Search ..... 327/108, 327/112; 326/82, 83
See application file for complete search history.

(56) References Cited

U.S. PATENT DOCUMENTS

| | | | | |
|---|---|---|---|---|
| 5,021,684 | A * | 6/1991 | Ahuja et al. | 326/27 |
| 5,148,506 | A * | 9/1992 | McDonald | 385/16 |
| 5,153,457 | A * | 10/1992 | Martin et al. | 326/84 |
| 5,381,044 | A | 1/1995 | Zisa et al. | 327/109 |
| 5,638,025 | A | 6/1997 | Johnson | 337/255 |
| 5,672,992 | A | 9/1997 | Nadd | 327/390 |
| 6,215,328 | B1 * | 4/2001 | Nasu | 326/83 |
| 6,344,959 | B1 | 2/2002 | Milazzo | 361/92 |
| 6,781,422 | B1 * | 8/2004 | Yang | 327/108 |

* cited by examiner

*Primary Examiner* — Lincoln Donovan
*Assistant Examiner* — John W Poos
(74) *Attorney, Agent, or Firm* — J.C. Patents

(57) ABSTRACT

The present invention discloses a capacitive high-side switch driver for a power converter. The capacitive high-side switch driver according to the present invention includes an inverter and two alternately conducting totem-pole buffers with complementary duty cycles. The duty cycles alternate in response to an input signal. The capacitive high-side switch driver further includes a low-side transistor and a high-side transistor. Once the low-side transistor is turned on, a bootstrap capacitor is charged to create a floating voltage via a charge-pump diode to supply power for the high-side switch driver. To supply additional power for the high-side switch driver, differential signals are produced to further charge the bootstrap capacitor via a bridge rectifier. The capacitive high-side switch driver utilizes a programmable load to provide variable impedance. Furthermore, an under-voltage protector supervises the supply voltage to ensure a reliable gate driving voltage.

23 Claims, 6 Drawing Sheets

FIG. 1 (Priort Art)

FIG. 2 (Priort Art)

CAPACITIVE HIGH-SIDE SWITCH DRIVER FOR A POWER CONVERTER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a high-side switch driver, and more particularly relates to a driver circuit for driving the high-side switch of a power converter.

2. Description of the Prior Art

Many commonly used power converters utilize bridge circuits to regulate a voltage source in response to a load. Some of these power converters include power supplies and motor drivers.

The bridge circuits used by these power converters are normally built from a pair of switching devices connected in series across the voltage source. The switching devices include a high-side switch and a low-side switch. The high-side switch is connected to the voltage source while the low-side switch is connected to the ground reference. A common node between the high-side switch and low-side switch is coupled to the load. The switches are generally transistor devices (MOSFET, IGBT, etc). The switches are controlled to alternately conduct, so that the common node will periodically swing in between the voltage source and the ground reference. When the high-side transistor is turned on, the voltage of the common node will rapidly shift to the voltage level of the voltage source. When the high-side transistor is fully turned on, the bridge circuit will operate in low-impedance mode. To turn on the high-side transistor, the gate drive voltage must exceed the voltage of the voltage source. Thus, the gate-to-source voltage of the high-side transistor will be floated with respect to the ground reference.

FIG. 1 demonstrates a technique that employs a pulse transformer 5 to create a floating voltage for driving a high-side transistor 10. However, the design of the pulse transformer 5 suffers from two disadvantages. First of all, its size is relatively large. Second, the pulse transformer 5 will require a substantially higher driving current due to magnetizing-current consumption.

FIG. 2 shows another prior-art bridge circuit using a bootstrap capacitor 30 and a charge-pump diode 40 to create a floating voltage for driving a gate of a high-side transistor 10. Switching on a transistor 45 will pull down the voltage at the gate of the high-side transistor 10 to the ground reference. The gate voltage of the high-side transistor 10 will be pulled down via a diode 42. This will turn off the high-side transistor 10. Once the high-side transistor 10 is turned off and a low-side transistor 20 is turned on, the floating voltage of the bootstrap capacitor 30 is charged up to a bias voltage $V_B$ via the charge-pump diode 40. Switching off the transistor 45 will turn on the high-side transistor 10 by conducting the floating voltage to the gate of the high-side transistor 10 via a transistor 41. The drawback of this circuit is that the gate voltage level might not be sufficient to ensure proper operation. Since the bootstrap capacitor 30 is charged via the low-side transistor 20, its charge time and the bootstrap voltage may decrease to an unacceptable level due to the reduced duty cycle of the low side transistor 20. Furthermore, the voltage drops across the diode 40 and the transistor 41 will cause the gate voltage level of the high-side transistor 10 to fall.

Recently, various techniques have been proposed for generating the required gate voltage for the high-side transistor in a more reliable manner. One such technique appears in U.S. Pat. No. 5,381,044 (Zisa, Belluso, Paparo), U.S. Pat. No. 5,638,025 (Johnson), and U.S. Pat. No. 5,672,992 (Nadd).

The drawback of these prior-arts is the need for a switch-off transistor such as the transistor 45. The prior-art bridge circuits listed above use something like the transistor 45 of FIG. 2 to turn off the high-side transistor. This switch-off transistor must be manufactured according to a high-voltage process, in order to be safely used in high-voltage applications (200 volts or more). To be integrated into a silicon chip, this high-voltage transistor requires a relatively thick coat of oxide and silicon. Furthermore, the parasitic capacitance of this high-voltage transistor will slow down the slew rate of the switching signal, thus resulting in significant high-side transistor switching losses. Therefore, these prior-arts are not suitable for high-voltage applications, or for high-speed applications.

To remedy this shortcoming, a technique using a boost converter is proposed in U.S. Pat. No. 6,344,959 (Milazzo). The boost converter is essentially a voltage doubling circuit. While this technique generates a more reliable gate voltage to drive the high-side transistor, it requires an additional switching element and other circuitry. This increases the cost and complexity of the driving circuit. Moreover, severe noise will be generated by the voltage source and the ground reference, due to high frequency charging and discharging of the voltage doubling capacitor in the charge pump.

The objective of the present invention is to provide a high-side switch driver for high-voltage and high-speed applications that overcome the drawbacks of prior art high-side switch drivers.

SUMMARY OF THE INVENTION

The capacitive high-side switch driver according to the present invention includes an inverter and two totem-pole buffers. The switch driver controls the totem-pole buffers in response to an input signal, in such a manner that they alternately conduct with complementary duty cycles. The outputs of the two totem-pole buffers drive two high-voltage capacitors. These high-voltage capacitors are further coupled to the input of a high-side circuit. The high-side circuit comprises a comparator, a programmable load, an under-voltage protector, and a drive-buffer for driving a high-side transistor. The high-side circuit further consists of a charge-pump diode and a bootstrap capacitor.

When the low-side transistor is turned on, the bootstrap capacitor is charged to drive the high-side transistor. The two totem-pole buffers and the two high-voltage capacitors generate differential signals to drive the comparator, and further charge the bootstrap capacitor via a bridge-rectifier. The bootstrap capacitor is used to supply power for the high-side circuit.

One objective of the present invention is to provide protection against low gate-voltage levels. The under-voltage protector enables the drive-buffer whenever the floating voltage exceeds the start-threshold voltage, and disables the drive-buffer whenever the floating voltage drops below the stop-threshold voltage. The under-voltage protector further protects the high-side circuit from an insufficient supply voltage and ensures a sufficient gate-voltage level for the high-side transistor.

Another objective of the present invention is to provide a high-side switch driver with improved noise immunity. This is accomplished by connecting a programmable load in parallel to the input of the comparator. The programmable load provides a variable impedance to prevent noise interference. Furthermore, the two totem-pole buffers produce a differential voltage across the input of the comparator. This differential voltage further strengthens the noise immunity of the high-side circuit, so that it will be suitable for use in high-voltage applications.

To raise the floating voltage and improve the efficiency of the high-side switch driver, the bias voltage charges the bootstrap capacitor when the low-side transistor is turned on. The differential signals also provide additional power via the bridge-rectifier.

The capacitive high-side switch driver according to the present invention overcomes the drawbacks of prior-art high-side switch drivers. In particular, the present invention provides a capacitive high-side switch driver that is suitable for high-voltage and high-speed applications. Moreover, the capacitive high-side switch driver according to the present invention is substantially more efficient and has stronger noise immunity than prior-art switch drivers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
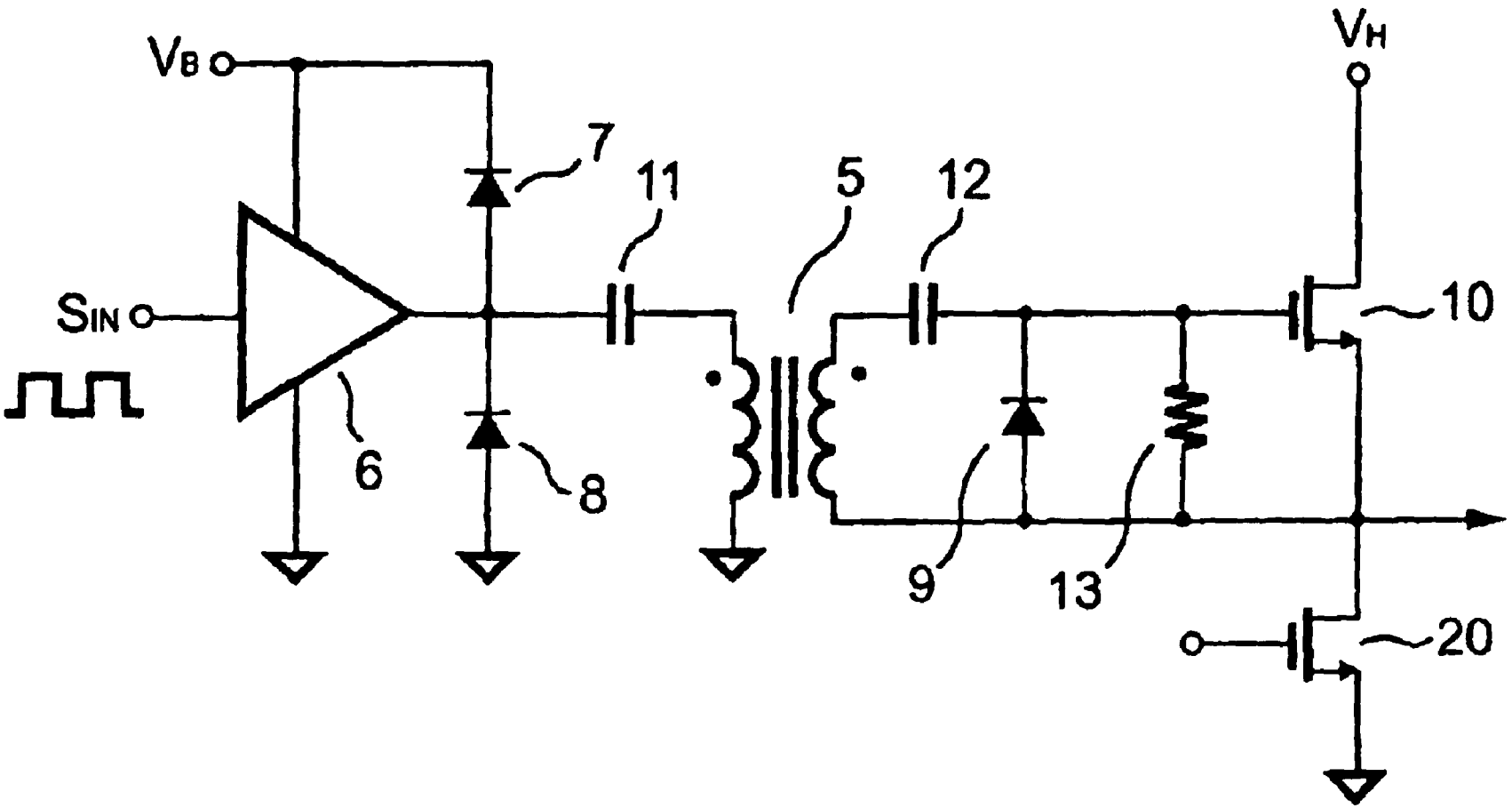
FIG. 1 shows a high-side switch driver using a pulse transformer.
Figure 2:
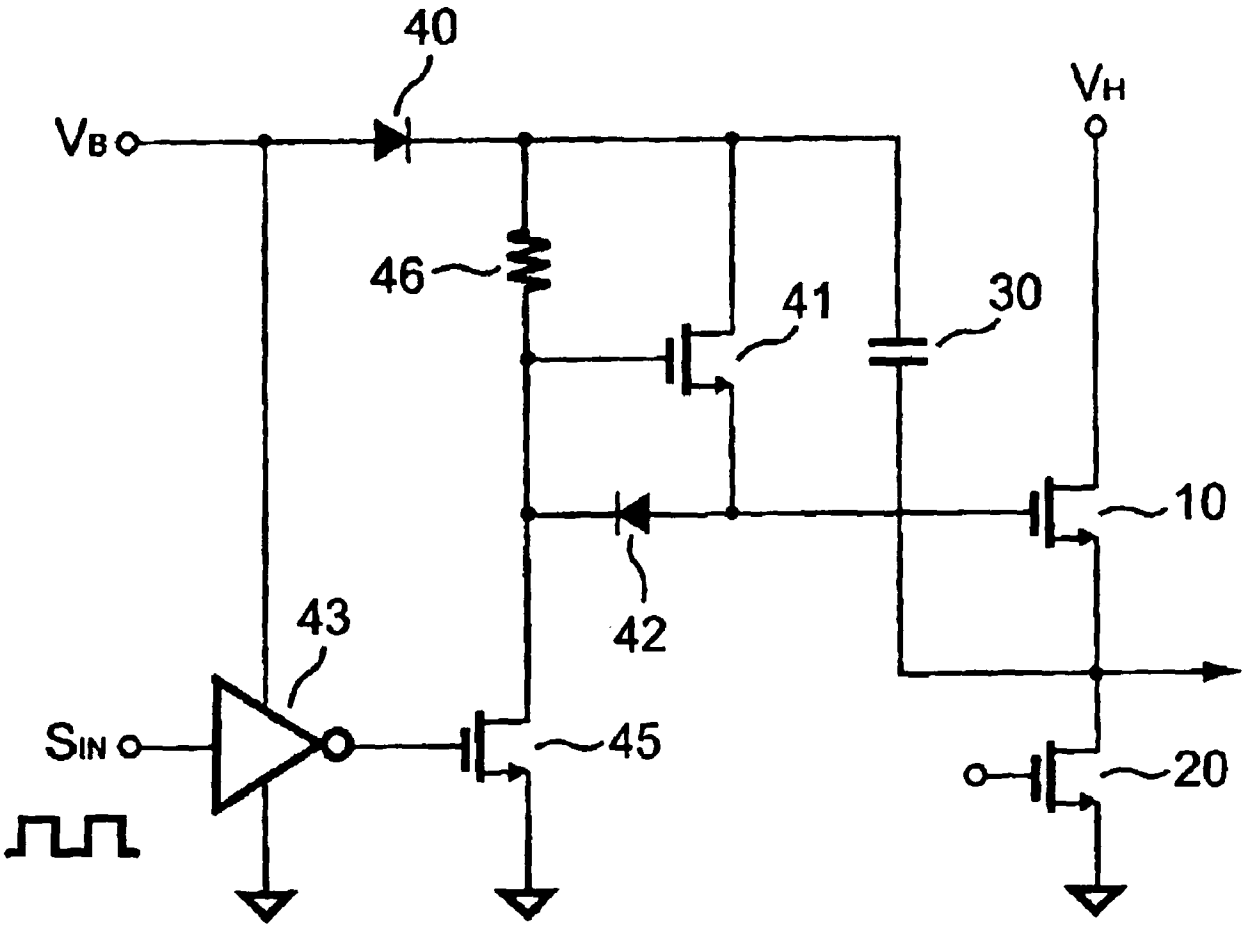
FIG. 2 shows a conventional high-side switch driver.
Figure 3:
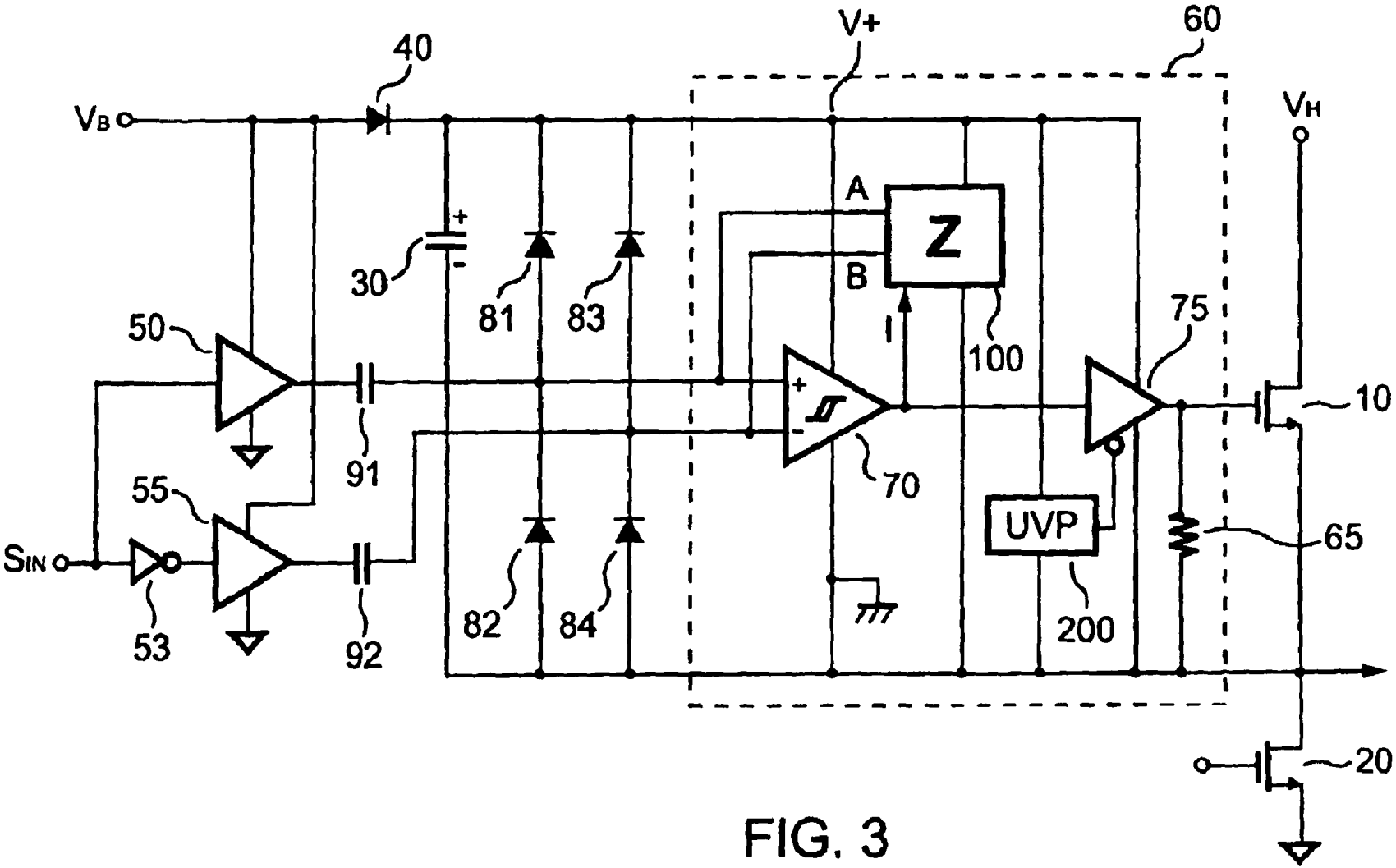
FIG. 3 shows the schematic circuit of a capacitive high-side switch driver according to the present invention.

FIG. 3 shows a capacitive high-side switch driver according to the present invention. The capacitive high-side switch driver comprises an inverter 53, a totem-pole buffer 50, and a totem-pole buffer 55. The totem-pole buffers 50 and 55 are controlled to alternately conduct in response to an input signal $S_{IN}$, so that their duty cycles are complementary. The totem-pole buffer 50 is driven by the input signal $S_{IN}$. The input signal $S_{IN}$ drives the totem-pole buffer 55 via the inverter 53. An output of the totem-pole buffer 50 drives a capacitor 91. An output of the totem-pole buffer 55 drives a capacitor 92. A high-side circuit 60 has an output terminal for driving a high-side transistor 10, wherein capacitors 91 and 92 are coupled to an input of the high-side circuit 60. The totem-pole buffers 50 and 55 and the capacitors 91 and 92 generate differential signals and produce a differential voltage across the input of the high-side circuit 60.

A charge-pump diode 40 and a bootstrap capacitor 30 are connected in series. An anode of the charge-pump diode 40 is connected to a bias voltage terminal $V_B$ *for receiving a bias voltage*. A negative terminal of the bootstrap capacitor 30 is connected to a source of the high-side transistor 10. A cathode of the charge-pump diode 40 and a positive terminal of the bootstrap capacitor 30 are tied together. When a low-side transistor 20 is turned on, the bias voltage $V_B$ will charge the bootstrap capacitor 30 and create a floating voltage to supply power for the high-side circuit 60. A rectifier 81, a rectifier 82, a rectifier 83, and a rectifier 84 form a bridge-rectifier having an input terminal and an output terminal. The input terminal of the bridge-rectifier is connected to the input of the high-side circuit 60. The output terminal of the bridge-rectifier is connected in parallel to the bootstrap capacitor 30. The differential signals further charge the bootstrap capacitor 30 via the bridge-rectifier to supply power for the high-side circuit 60.

The high-side circuit 60 further comprises a comparator 70 and a drive-buffer 75. An input of the comparator 70 is connected to the input of the high-side circuit 60. An output of the drive-buffer 75 [drives] *generates a gate driving signal to drive* a gate of the high-side transistor 10. An input of the drive-buffer 75 is connected to an output of the comparator 70. The comparator 70 has a turn-on threshold. When the differential voltage across the inputs of the comparator 70 exceeds the turn-on threshold, the comparator 70 will output a logic-high *enable* signal. A programmable load 100 is connected in parallel with the inputs of the comparator 70. The programmable load 100 provides variable impedance in response to the magnitude of the voltage at the output of the comparator 70. An input of the programmable load 100 is connected to the output of the comparator 70. When the voltage at the output of the comparator 70 is logic-low, the programmable load 100 will generate low impedance. When the voltage at the output of the comparator 70 is logic-high, the impedance of the programmable load 100 will increase in proportion to the length of the logic-high output period of the comparator 70.

The capacitive high-side switch driver according to present invention further includes an under-voltage protector (UVP) 200 connected in parallel with the bootstrap capacitor 30. The under-voltage protector 200 is used to detect the floating voltage of the bootstrap capacitor 30. The output of the under-voltage protector 200 is connected to an enable terminal of the drive-buffer 75. The under-voltage protector 200 will enable the drive-buffer 75 whenever the floating voltage exceeds a start threshold voltage. Furthermore, the under-voltage protector 200 will turn off and/or disable the drive-buffer 75 whenever the floating voltage goes below a stop-threshold voltage. A resistor 65 is connected from the output of the drive-buffer 75 to a negative terminal of the bootstrap capacitor 30. The resistor 65 is used to shut off the high-side transistor 10 when the drive-buffer 75 is disabled.

Figure 4:
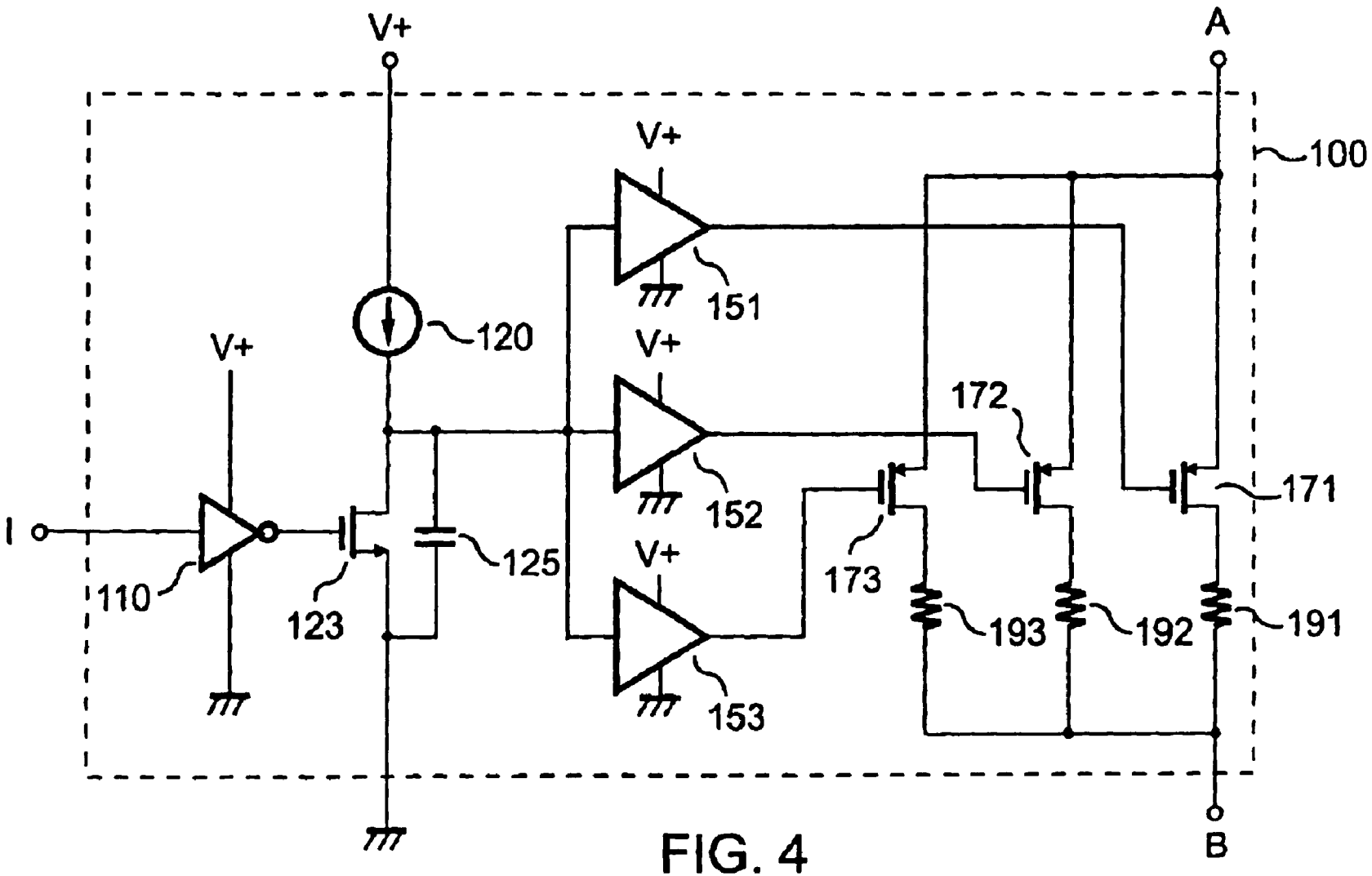
FIG. 4 shows a programmable load according to a preferred embodiment of the present invention.

FIG. 4 shows a programmable load 100 according to a preferred embodiment of the present invention. The programmable load 100 has a pl-ground terminal connected to the negative terminal of the bootstrap capacitor 30. The programmable load 100 further includes a voltage terminal connected to the positive terminal of the bootstrap capacitor 30. The programmable load 100 further comprises an inverter 110, a constant current source 120, a transistor 123, a capacitor 125, three buffers 151, 152 and 153, three transistors 171, 172 and 173, and three resistors 191, 192 and 193.

An input of the inverter 110 is connected to the output of the comparator 70. The transistor 123 has a gate connected to an output of the inverter 110. A source of the transistor 123 is connected to the pl-ground terminal of the programmable load 100. The constant current source 120 is connected to a drain of the transistor 123. The capacitor 125 is connected from the drain of the transistor 123 to the pl-ground terminal. The buffer 151, the buffer 152, and the buffer 153 have a first input-threshold, a second input-threshold, and a third input-threshold respectively. An input of the buffer 151, an input of the buffer 152, and an input of the buffer 153 are tied to the drain of the transistor 123. The transistor 171 and the resistor 191 are connected in series, and further connected in parallel with the inputs of the comparator 70. The transistor 172 and the resistor 192 are connected in series, and further connected in parallel with the inputs of the comparator 70. The transistor 173 and the resistor 193 are connected in series, and further connected in parallel with the inputs of the comparator 70. A gate of the transistor 171 is connected to an output of the buffer 151. A gate of the transistor 172 is connected to an output of the buffer 152. A gate of the transistor 173 is connected to an output of the buffer 153.

When the output of the comparator 70 becomes logic-high, the constant current source 120 will start to charge the capacitor 125. When the voltage of the capacitor 125 exceeds the first input-threshold voltage, the transistor 171 will be shut off. When the voltage of the capacitor 125 exceeds the second input-threshold voltage, the transistor 172 will be shut off. When the voltage of the capacitor 125 exceeds the third input-threshold voltage, the transistor 173 will be shut off. Thus, the impedance of the programmable load 100 is increased in proportion to the voltage of the capacitor 125. In this manner, the impedance of programmable load 100 is also increased in proportion to the length of the logic-high output period of the comparator 70.

Figure 5:
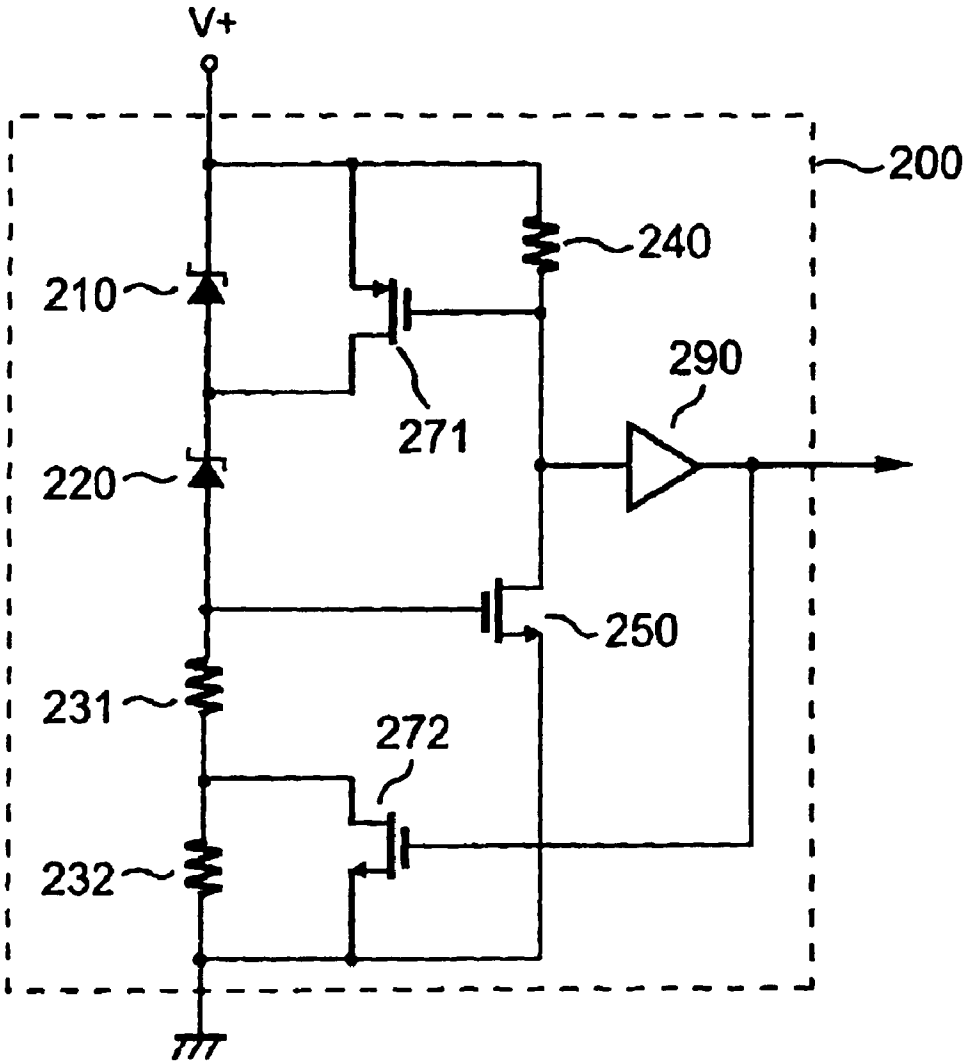
FIG. 5 shows an under-voltage protector according to a preferred embodiment of the present invention.

FIG. 5 shows an under-voltage protector 200 according to a preferred embodiment of the present invention. A voltage V+ is supplied from the positive terminal of the bootstrap capacitor 30. The negative terminal of the bootstrap capacitor 30 is connected to a uv-ground reference. Two resistors 231 and 232, and two zener diodes 210 and 220 are connected in series. The voltage V+ is supplied to the zener diode 210. The resistor 232 is connected to the uv-ground reference.

An n-transistor 250 has a gate connected to the junction of the zener diode 220 and the resistor 231. A source of the n-transistor 250 is connected to the uv-ground reference. The drain of the n-transistor 250 is connected to a gate of a p-transistor 271. A source of the p-transistor 271 is connected to a cathode of the zener diode 210. A drain of the p-transistor 271 is connected to the junction of the zener diode 210 and the zener diode 220. A resistor 240 is connected in parallel between the gate and the source of the p-transistor 271. The drain of the n-transistor 250 is further connected to an input of a buffer 290. An output of the buffer 290 is further connected to the enable terminal of the drive-buffer 75. The output of the buffer 290 drives a gate of an n-transistor 272. A drain of the n-transistor 272 is connected to the junction of the resistor 231 and the resistor 232. A source of the n-transistor 272 is connected to the uv-ground reference. The voltages of the zener diodes 210 and 220 determine the start-threshold voltage for the under-voltage protector 200. The voltage of the zener diode 220 determines the stop threshold voltage for the under-voltage protector 200.

Referring to FIG. 3, the totem-pole buffers 50 and 55 drive the high-side circuit 60 via the capacitors 91 and 92. The capacitors 91 and 92 generate differential signals to enable high-speed switching. Two totem-pole buffers 50 and 55 produce a differential voltage across the inputs of the comparator 70. The differential voltage is produced via the two capacitors 91 and 92. The programmable load 100 uses the differential voltage to strengthen the noise immunity of the high-side circuit 60. This feature is designed specifically for high-voltage applications. The bias voltage $V_B$ is supplied to charge the bootstrap capacitor 30 when the low-side transistor 20 is turned on.

To further raise the floating voltage and improve the efficiency of the high-side switch driver, the differential signals are also used to charge the bootstrap capacitor 30. The differential signals charge the bootstrap capacitor 30 via the bridge-rectifier. The under-voltage protector 200 further protects the high-side circuit 60 from an insufficient supply voltage and ensures a sufficient gate voltage level.

Figure 6:
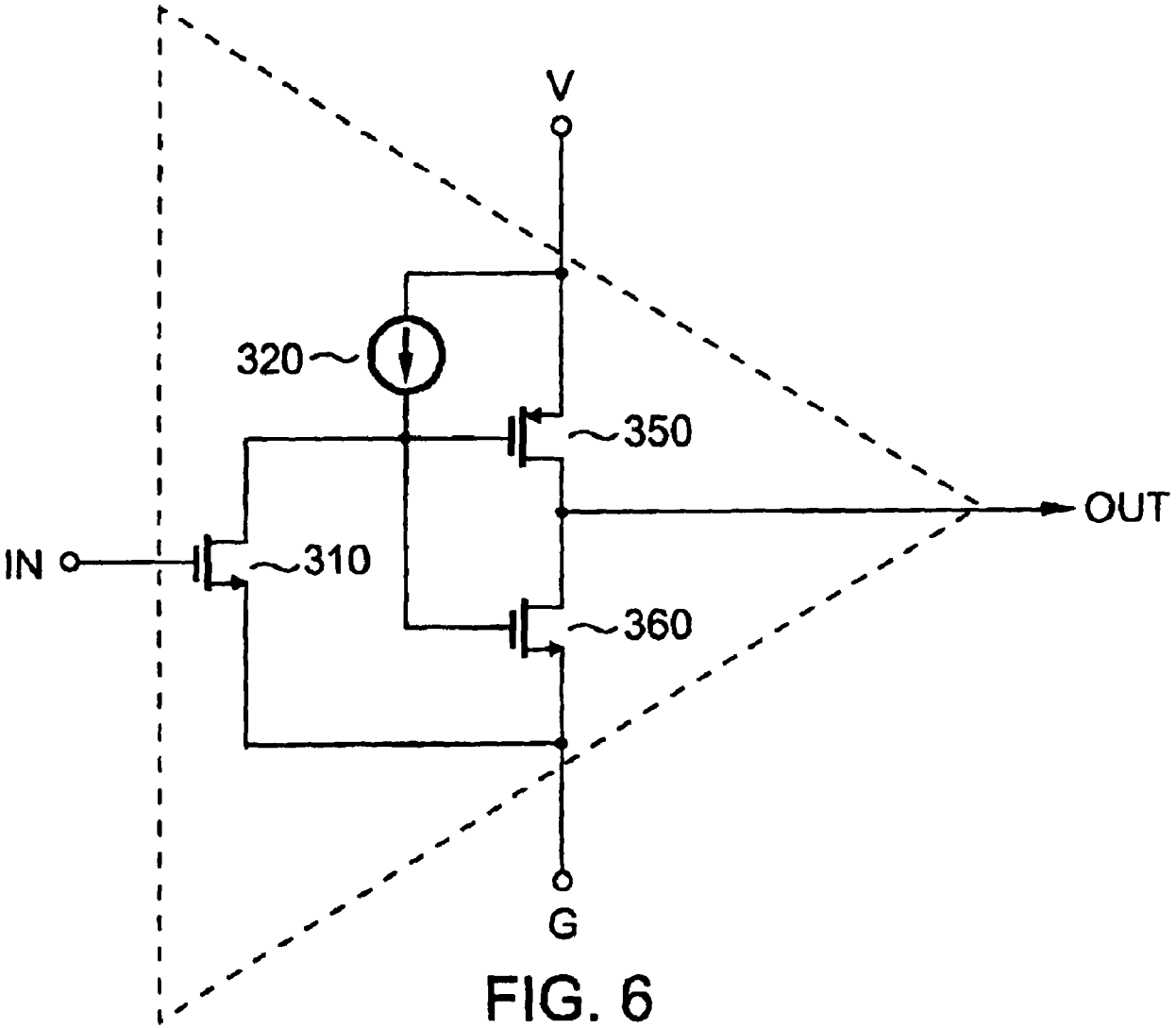
FIG. 6 shows a schematic circuit of the buffer, for reference purposes.

FIG. 6 shows a schematic circuit of a buffer *circuit*, for reference purposes. This *buffer circuit* demonstrates how to build the totem-pole buffers 50 and 55, the buffers 151, 152, 153 and 290. The buffer *circuit* includes two n-transistors 310 and 360, a p-transistor 350, and a current source 320. A gate of the n-transistor 310 is connected to an input of the buffer *circuit*. A drain of the n-transistor 310, a gate of the n-transistor 360, and a gate of the p-transistor 350 are tied together. The current source 320 is coupled to the drain of the n-transistor 310. A drain of the p-transistor 350 and a drain of the n-transistor 360 are connected to an output of the buffer *circuit*. The operation of this *buffer* circuit will be well known to those skilled in the art and does not need to be discussed in further detail here.

The capacitive high-side switch driver according to the present invention can overcome many of the shortcomings of prior-art high-side switch drivers. In particular, the capacitive high-side switch driver according to the present invention is particularly well suited for use in high-voltage and high-speed applications. Some of the advantages of the capacitive high-side switch driver according to the present invention include significantly higher efficiency and strengthened noise immunity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims or their equivalents.

What is claimed is:

1. A capacitive high-side switch driver comprising:

an inverter having an input for receiving an input signal;

a first totem-pole buffer and a second totem-pole buffer, wherein said first totem-pole buffer is driven by said input signal and said second totem-pole buffer is driven by an output of said inverter;

a first high-voltage capacitor and a second high-voltage capacitor, wherein the outputs of said first and second totem-pole buffers drive said first and second high-voltage capacitors respectively;

a high-side transistor and a low-side transistor;

a high-side circuit having an output terminal for driving said high-side transistor, wherein said first and second high-voltage capacitors are coupled to an input of said high-side circuit;

a charge-pump diode having an anode supplied with a bias voltage;

a bootstrap capacitor connected in series with said charge-pump diode, wherein said bootstrap capacitor has a negative terminal connected to a source of said high-side transistor, wherein said bootstrap capacitor has a positive terminal connected to a cathode of said charge-pump diode; and a bridge rectifier, wherein an input terminal of said bridge rectifier is connected to the input of said high-side circuit, wherein said bridge rectifier is connected in parallel with said bootstrap capacitor.

2. The capacitive high-side switch driver according to claim 1, wherein said first and second totem-pole buffers are controlled to alternately conduct in response to said input signal, wherein the duty cycles of said first and second totem-pole buffers are complementary.

3. The capacitive high-side switch driver according to claim 1, wherein said bias voltage will charge said bootstrap capacitor and create a floating voltage to supply power for said high-side circuit, whenever said low-side transistor is turned on.

4. The capacitive high-side switch driver according to claim 1, wherein said first and second totem-pole buffers associate with said first and second high-voltage capacitors to generate differential signals and produce a differential voltage across said input of said high-side circuit.

5. The capacitive high-side switch driver according to claim 1, wherein said bridge rectifier consists of four rectifiers, wherein said differential signals charge said bootstrap capacitor via said bridge-rectifier, wherein said differential signals enable said bootstrap capacitor to supply additional power to said high-side circuit.

6. The capacitive high-side switch driver according to claim 1, wherein said high-side circuit comprises:

a comparator having a turn-on threshold, wherein an input of said comparator is connected to said input of said high-side circuit;

a drive-buffer having an output for driving a gate of said high-side transistor, wherein an input of said drive-buffer is connected to an output of said comparator;

a programmable load for providing variable impedance in response to a signal from said output of said comparator, wherein said programmable load is connected in parallel with said input of said comparator, wherein an input of said programmable load is connected to said output of said comparator;

an under-voltage protector for detecting the floating voltage of said bootstrap capacitor, wherein said under-voltage protector is connected in parallel with said bootstrap capacitor, wherein an output of said under-voltage protector is connected to an enable terminal of said drive-buffer; and a pull-low resistor for turning off said high-side transistor, wherein said pull-low resistor is connected from said output of said drive-buffer to said negative terminal of said bootstrap capacitor, wherein said pull-low resistor is used to turn-off said high-side transistor whenever said drive-buffer is disabled.

7. The capacitive high-side switch driver according to claim 6, wherein said comparator will output a logic-high signal whenever the differential voltage across the input of said comparator exceeds a turn-on threshold voltage.

8. The capacitive high-side switch driver according to claim 6, wherein said under-voltage protector enables said drive-buffer whenever the floating voltage exceeds a start threshold voltage, wherein said under-voltage protector disables said drive-buffer whenever the floating voltage drops below a stop threshold voltage.

9. The capacitive high-side switch driver according to claim 6, wherein said programmable load has a low impedance whenever said comparator outputs a logic-low signal, wherein the impedance of said programmable load increases in proportion to the logic-high output period of said comparator.

10. The *capacitive* high-side [circuit] *switch driver* according to claim 6, wherein said programmable load comprises:

a pl-vcc terminal connected to said positive terminal of said bootstrap capacitor;

a pl-ground terminal connected to said negative terminal of said bootstrap capacitor;

a pl-inverter having an input connected to said output of said comparator, wherein said input of said pl-inverter is connected to said input of said programmable load;

a pl-n transistor, wherein a gate of said pl-n transistor is connected to an output of said pl-inverter, wherein a source of said pl-n transistor is connected to said pl-ground terminal;

a constant current source connected between said pl-vcc terminal and a drain of said pl-n transistor;

a pl-capacitor connected from said drain of said pl-n transistor to said pl-ground terminal;

a first pl-buffer having a first input-threshold voltage level;

a second pl-buffer having a second input-threshold voltage level;

a third pl-buffer having a third input-threshold voltage level, wherein an input of said first pl-buffer, an input of said second pl-buffer, and an input of said third pl-buffer are connected together to said drain of said pl-n transistor, a first pl-p transistor having a gate connected to an output of said first pl-buffer;

a first pl-resistor connected in series with said first pl-p transistor, wherein said first pl-p transistor and said first pl-resistor are connected in parallel with said input of said comparator;

a second pl-p transistor having a gate connected to an output of said second pl-buffer;

a second pl-resistor connected in series with said second pl-p transistor, wherein said second pl-p transistor and said second pl-resistor are connected in parallel with said input of said comparator;

a third pl-p transistor having a gate connected to an output of said third pl-buffer; and a third pl-resistor connected in series with said third pl-p transistor, wherein said third pl-p transistor and said third pl-resistor are connected in parallel with said input of said comparator.

11. The *capacitive* high-side [circuit] *switch driver* according to claim 10, wherein said constant current source will start to charge said pl-capacitor so as to increase the voltage across said pl-capacitor, whenever said comparator outputs a logic-high signal.

12. The *capacitive* high-side [circuit] *switch driver* according to claim 10, wherein said first pl-p transistor will be turned off as the voltage of said pl-capacitor exceeds said first input-threshold voltage level, wherein said second pl-p transistor will be turned off as the voltage of said pl-capacitor exceeds said second input-threshold voltage level, wherein said third pl-p transistor will be turned off as the voltage of said pl-capacitor exceeds said third input-threshold voltage level.

13. The *capacitive* high-side [circuit] *switch driver* according to claim 6, wherein said under-voltage protector comprises:

an uv-vcc terminal connected to said positive terminal of said bootstrap capacitor;

an uv-ground terminal connected to said negative terminal of said bootstrap capacitor;

a first uv-resistor and a second uv-resistor;

a first zener diode and a second zener diode connected in series with said first uv-resistor and second uv-resistor, wherein said first zener diode is connected to said uv-vcc terminal and said second uv-resistor is connected to said uv-ground terminal;

a first uv-n transistor having a gate connected to the junction of said second zener diode and said first uv-resistor, wherein a source of said first uv-n transistor is connected to said uv-ground terminal;

an uv-p transistor having a gate connected to a drain of said first uv-n transistor, wherein said uv-p transistor has a source and a drain connected in parallel with said first zener diode;

a third uv-resistor connected from said gate of said uv-p transistor to the uv-vcc terminal;

an uv-buffer having an input connected to said drain of said first uv-n transistor, wherein an output of said uv-buffer is connected to said enable terminal of said drive-buffer, wherein said output of said uv-buffer is further connected to an output of said under-voltage protector; and a second uv-n transistor, wherein said output of said uv-buffer drives a gate of said second uv-n transistor, wherein a drain of said second uv-n transistor is connected to the junction of said first uv-resistor and said second uv-resistor, wherein a source of said second uv-n transistor is connected to the uv-ground terminal.

*14. A high-side switch driver, comprising:*

*a buffer circuit, having an input and an output, said input of said buffer circuit being supplied with an input signal, said buffer circuit generating differential signals;*

*a charge-pump diode, having an anode supplied with a bias voltage;*

*a bootstrap capacitor, coupled to a cathode of said charge-pump diode, wherein a floating voltage is generated across said bootstrap capacitor;*

*a high-side circuit, powered by said bootstrap capacitor, said high-side circuit having an input coupled to said output of said buffer circuit, said high-side circuit further having an output for driving a high-side switch; and*

*two high-voltage capacitors, coupled to said buffer circuit to drive said high-side circuit.*

*15. The high-side switch driver as claimed in claim 14, further comprising a bridge-rectifier, having an input coupled to said output of said buffer circuit, wherein said bridge-rectifier is connected in parallel with said bootstrap capacitor to receive said differential signals to additionally power said high-side circuit.*

*16. The high-side switch driver as claimed in claim 14, said high-side circuit comprising:*

*a comparator, having two inputs coupled to said input of said high-side circuit for receiving said differential signals;*

*a resistance device, coupled to said comparator to provide impedance to said comparator; and*

*a driver-buffer, coupled between an output of said comparator and said high-side switch to drive said high-side switch.*

*17. The high-side switch driver as claimed in claim 16, said high-side circuit further comprising:*

*an under-voltage protector, for enabling said driver-buffer while said floating voltage being higher than a start-threshold voltage and disabling said driver-buffer while said floating voltage being lower than a stop-threshold voltage, wherein said stop-threshold voltage determines an insufficient driving capability for said high-side switch driver.*

*18. The high-side switch driver as claimed in claim 16, said resistance device comprising:*

*a switch, controlled by said output of said comparator;*

*a capacitor, coupled in parallel with said switch, said capacitor being charged to generate a threshold voltage, wherein said threshold voltage increases in response to an off-period of said switch;*

*a plurality of buffers; and*

*a plurality of resistors, wherein said resistors are connected in parallel with each other and controlled by said buffers to determine said impedance of said resistance device.*

*19. The high-side switch driver as claimed in claim 16, said resistance device being coupled to said comparator to strengthen noise immunity of said high-side switch driver.*

*20. A method of improving efficiency for a high-side switch, comprising:*

*receiving a floating voltage;*

*generating a differential signal;*

*generating an enable signal as said differential signal exceeding a turn-on threshold; and*

*generating a gate driving signal in response to said enable signal, wherein said gate driving signal is powered by said floating voltage to control said high-side switch.*

*21. The method as claimed in claim 20, further comprising:*

*providing an additional power for said floating voltage with said differential signal.*

*22. The method as claimed in claim 20, further comprising:*

*providing a resistance device to strengthen noise immunity for stable driving capability, wherein said resistance device is varied in response to an on-time of said enable signal.*

*23. The method as claimed in claim 20, further comprising:*

*enabling said gate driving signal as said floating voltage being higher than a start-threshold voltage; and*

*disabling said gate driving signal as said floating voltage being lower than a stop-threshold voltage.*

* * * * *